United States Patent
Yang et al.

(10) Patent No.: US 10,251,240 B1
(45) Date of Patent: Apr. 2, 2019

(54) DC CONCENTRATED ILLUMINATION SYSTEM AND METHOD FOR MEASURING THE STATE OF THE LAMPS THEREOF

(71) Applicant: Delta Electronics (Shanghai) Co., Ltd., Shanghai (CN)

(72) Inventors: Bo Yang, Shanghai (CN); Tao Zhang, Shanghai (CN); Xiaojing Shi, Shanghai (CN); Xiaojun Xia, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 16/116,898

(22) Filed: Aug. 29, 2018

(30) Foreign Application Priority Data

Dec. 6, 2017 (CN) .......................... 2017 1 1277761

(51) Int. Cl.
| | |
|---|---|
| H05B 37/02 | (2006.01) |
| H05B 33/08 | (2006.01) |
| G01R 15/20 | (2006.01) |
| G01R 19/00 | (2006.01) |
| H02J 1/00 | (2006.01) |

(52) U.S. Cl.
CPC ............ *H05B 37/02* (2013.01); *G01R 15/202* (2013.01); *G01R 19/0092* (2013.01); *H02J 1/00* (2013.01); *H05B 33/0809* (2013.01); *H02J 2001/008* (2013.01)

(58) Field of Classification Search
None
See application file for complete search history.

(56) References Cited

U.S. PATENT DOCUMENTS

2013/0134891 A1* 5/2013 Woytowitz ............. H05B 37/02
315/201
2016/0360592 A1* 12/2016 Yang .................. H05B 37/0263

FOREIGN PATENT DOCUMENTS

| CN | 105101593 A | 11/2015 |
|---|---|---|
| CN | 103763833 B | 3/2016 |

* cited by examiner

*Primary Examiner* — Jany Richardson
(74) *Attorney, Agent, or Firm* — CKC & Partners Co., LLC

(57) ABSTRACT

The present disclosure provides a DC concentrated illumination system, including a DC distribution box configured for converting a command specification that controls the state of lamps into a voltage signal with a varying amplitude, and outputting the voltage signal via a power line; and a plurality of lamp units, each includes a lamp, a power conversion unit and a simulated load unit, wherein the power conversion unit is coupled to the lamp and the simulated load unit, and is coupled to the DC distribution box via the power line. The power conversion unit receives the voltage signal and collects the state information of the lamps when the voltage signal matches a preset convention rule successfully; and the power conversion unit controls the action of the simulated load unit to get a current signal, the DC distribution box parses the current signal to obtain the state information of the lamps.

20 Claims, 4 Drawing Sheets

DC CONCENTRATED ILLUMINATION SYSTEM AND METHOD FOR MEASURING THE STATE OF THE LAMPS THEREOF

CROSS REFERENCE

This application is based upon and claims priority to Chinese Patent Application No. 201711277761.1, filed on Dec. 6, 2017, the entire content thereof is incorporated herein by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

TECHNICAL FIELD

The present disclosure relates to a DC concentrated illumination system, particularly a DC concentrated illumination system capable of measuring the state of lamps and a method for measuring the state of the lamps thereof.

BACKGROUND

In a DC concentrated illumination system, a DC distribution box is crucial for the remote detection of states of lamps, such as the detection of the ON/OFF state, energy consumption and operating temperature of the lamps, so as to learn whether the lamps are malfunctioning or working properly.

During the use of an existing DC concentrated illumination system, malfunctioning lamps are inevitable. At present, the positioning and judgment of malfunctioning lamps are mostly determined manually. In this way, only when there are quite a few malfunctioning lamps, will they be changed all together. Because the problem may not be solved in time, it brings considerable inconvenience to the later engineering maintenance and also bothers the users.

Additionally, a separate communication module may be mounted on the lamp for two-way communication between the DC distribution box and the lamp, thereby enabling the control of the state of lamps and the echo of state detection information. For example, a wireless communication module may be mounted on the lamp. Referring to FIG. 1, the detection of the state of lamps may be enabled through a wireless communication mode such as Zigbee or WIFI. Alternatively, a wired communication module is mounted on the lamp. Referring to FIG. 2, the detection of the state of lamps may be enabled through a wired communication such as 485, DMX512 or DALI. However, the two manners both have some deficiencies. On the one hand, both of them require additional communication modules, resulting in complex networking, apt to be interfered, and a high failure rate; on the other hand, the cost of state detection is high, thus they are not suitable in some low-cost application occasions.

Further, CN103763833B discloses a method and system for controlling LED street lamps based on power supply lines, which employ a direct current power supply communication method and which can enable a remote control of dimming, state detection and so on of the street lamps. However, by doing so, the lamp unit can only be controlled as a whole while it is impossible to detect the state of any single lamp. CN105101593A discloses a system and method for detecting street lamp faults, which detects the current output from a power cabinet to enable the fault detection of lamps. However, this method can only enable the fault detection of lamps during turning off or turning on the lamps; in addition, due to the lamp fault detection in a single form, only ON/OFF of a single lamp can be known, while the other states, such as energy consumption and temperature, etc., of the lamps cannot be detected.

When there is a need to enable the state detection of a single lamp in any states, none of the above methods prove effective. Therefore, it is necessary to propose a DC concentrated illumination system capable of measuring the state of lamps and a method for measuring the state of the lamps thereof to change the negative effects of the prior art and solve the problems in the current application processes.

SUMMARY

According to one aspect of the present disclosure, a DC concentrated illumination system is provided. The DC concentrated illumination system includes a DC distribution box and a plurality of lamp units. The DC distribution box converts a command specification that controls the state of the lamps into a voltage signal with a varying amplitude, and outputs the voltage signal via a power line. Each lamp unit includes a lamp, a power conversion unit and a simulated load unit, wherein the power conversion unit is coupled to the lamp and the simulated load unit, and is coupled to the DC distribution box via the power line. The power conversion unit receives the voltage signal and determines whether the voltage signal matches a preset convention rule. If matches successfully, the power conversion unit collects state information of the lamps. The power conversion unit controls the action of the simulated load unit to get a current signal corresponding to the state information of the lamps, the current signal is transmitted back to the DC distribution box via the power line; and the DC distribution box parses the current signal to obtain the state information of the lamps.

According to another aspect of the present disclosure, a method for measuring the state of lamps in a DC concentrated illumination system is provided. The DC concentrated illumination system includes a DC distribution box and a plurality of lamp units coupled to the DC distribution box. Each lamp unit includes a lamp, a power conversion unit coupled to the lamp, and a simulated load unit coupled to the power conversion unit. The method includes the following steps, the DC distribution box converts a command specification that controls the lamp units into a voltage signal with a varying amplitude, and transmits the voltage signal to the power conversion unit via a power line;

the power conversion unit receives the voltage signal and determines whether the voltage signal matches a preset convention rule;

if matches successfully, the power conversion unit collects the state information of the lamps;

the power conversion unit controls the action of the simulated load unit to get a current signal corresponding to the state information of the lamps, and the current signal is transmitted back to the DC distribution box via the power line;

the DC distribution box parses the current signal to obtain the state information of the lamps.

DETAILED DESCRIPTION

The technical solution of the present disclosure will be described in detail below with reference to illustrations and embodiments for a better understanding of the objects, solutions and effects of the present disclosure, but it is not intended to limit the scope of the present disclosure.

In some embodiments, a DC concentrated illumination system capable of measuring the state of lamps and a method for measuring the state of the lamps thereof is provided, which ensure on-line detection of the state of lamps at a low cost, wherein the state includes ON/OFF state, energy consumption state and temperature state, etc.; moreover, data transmission utilizing a power line can improve the reliability of the product as a whole.

Figure 1:
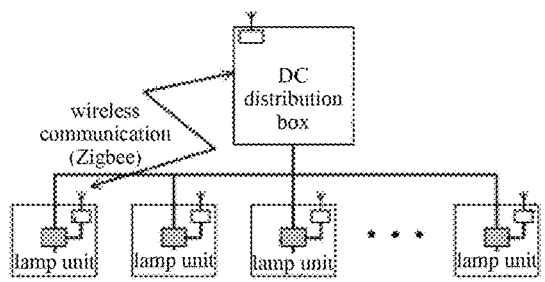
FIG. 1 is a schematic diagram of an existing DC concentrated illumination system that uses a wireless communication module for communication.
Figure 2:
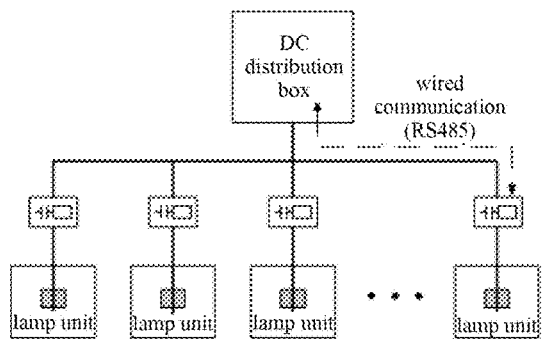
FIG. 2 is a schematic diagram of an existing DC concentrated illumination system that uses a wired communication module for communication.
Figure 3:
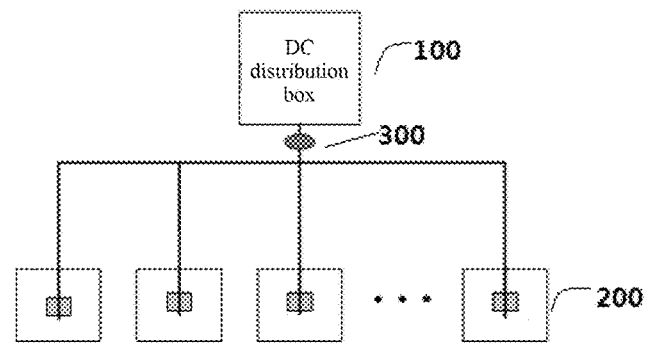
FIG. 3 is a schematic diagram of a DC concentrated illumination system that uses a power line for communication, according to the present disclosure.
Figure 4:
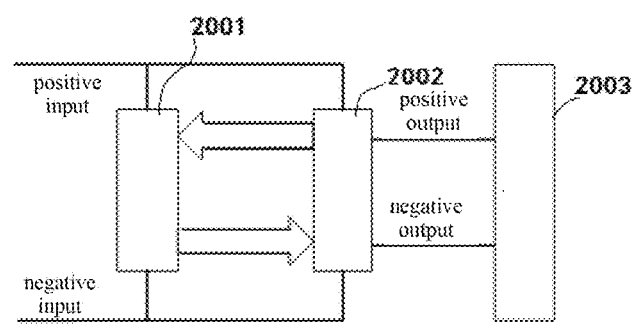
FIG. 4 is a schematic diagram of the structure of a lamp unit in an embodiment of the present disclosure.

Please refer to FIGS. 3 and 4, of which FIG. 3 is a schematic diagram of a DC concentrated illumination system according to the present disclosure that uses a power line for communication, and FIG. 4 is a schematic diagram of the structure of a lamp unit in an embodiment of the present disclosure. As shown in FIGS. 3 and 4, this embodiment discloses a DC concentrated illumination system, including a DC distribution box 100 and a plurality of lamp units 200 coupled in parallel to the DC distribution box 100. Each lamp unit 200 further includes a lamp 2003, a power conversion unit 2002, and a simulated load unit 2001.

The DC distribution box 100 converts a command specification that controls the state of the lamps into a voltage signal with varying amplitude, and outputs the voltage signal via a power line. The power conversion unit 2002 is coupled to the lamp 2003 and the simulated load unit 2001, and coupled to the DC distribution box 100 via the power line. The power conversion unit 2003 is used to convert the direct current output from the DC distribution box 100 into a constant current output or a constant voltage output required by the lamp 2003, and to collect the related state information of the lamp 2003.

The power conversion unit 2002 receives the voltage signal and determines whether the voltage signal matches a preset convention rule. If matches successfully, the power conversion unit 2002 collects the state information of the lamps 2003. The power conversion unit 2002 controls the action of the simulated load unit 2001 to get a current signal corresponding to the state information of the lamps 2003, and the current signal is transmitted back to the DC distribution box 100 via the power line. The DC distribution box 100 parses the current signal to obtain the state information of the lamps 2003.

Each lamp unit 200 has its own physical and logical addresses. The DC distribution box 100 records the physical and logical addresses of all the lamp units 200, controls the ON/OFF and dimming of all the lamps 2003, and records the related state information of the lamps 2003 uploaded by the power conversion unit 2002. After receiving an instruction sent from the DC power distribution box 100, the power conversion unit 2002 activates the simulated load unit 2001, which cooperates with the power conversion unit 2002 to respond to the corresponding command of the DC power distribution box 100 to realize data reporting of the related state information of the lamps 2003.

The DC distribution box 100 is equipped with a current sensor 300 for detecting the current signal on the power line so as to count the power consumption of the lamps 2003. This solution makes use of a current sensor 300 to detect a change in current on the power line when the system is operating to realize the state detection of the lamps 2003. In some embodiments, the current sensor 300 may be a current Hall or a shunt, but the present disclosure is not limited thereto. The current sampling accuracy of the current sensor 300 matches the size of the simulated load unit 2001, while the size of the simulated load is determined by the current sampling accuracy of the current sensor 300. The command specification includes the logical address information and start state detection information of the lamp units 200. When the voltage signal received by the power conversion unit 2002 matches the convention rule, the power conversion unit 2002 starts to collect the state information of the lamps 2003.

The simulated load unit 2001 includes a switch element or resistor. For example, the simulated load unit 2001 may include a conventional semiconductor device, such as MOS, triode, or the like, and by dynamically adjusting the operating state of the switch element, the current level on the power line may be adjusted. The state information of the lamps 2003 includes ON/OFF state information, energy consumption state information, temperature state information, or the like.

Please refer to FIG. 4 again. FIG. 4 is a schematic diagram of the structure of a lamp unit in the first embodiment of the present disclosure. As shown in FIG. 4, each lamp unit 200 includes a lamp 2003, a power conversion unit 2002 coupled to the lamp 2003, and a simulated load unit 2001 coupled to the power conversion unit 2002.

Figure 5:
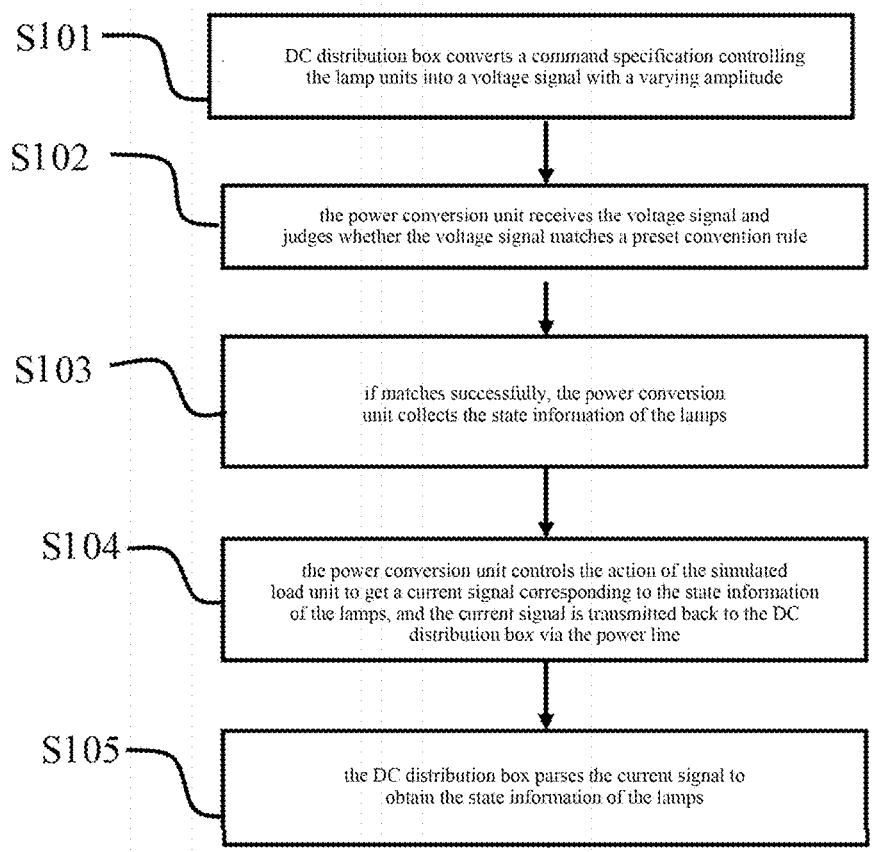
FIG. 5 is a flowchart of a method for measuring the state of lamps in a DC concentrated illumination system according to the present disclosure.

Hereafter, a method for measuring the state of lamps in a DC concentrated illumination system will be illustrated. Please refer to FIG. 5, which is a flowchart of a method for measuring the state of lamps in a DC concentrated illumination system according to the present disclosure. As shown in FIG. 5, the measuring method includes the following steps:

S101: the DC distribution box 100 converts a command specification that controls the lamp units 200 into a voltage signal with a varying amplitude, and transmits the voltage signal to the power conversion unit 2002 via a power line;

S102: the power conversion unit 2002 receives the voltage signal and determines whether the voltage signal matches a preset convention rule;

S103: if the match is successful, the power conversion unit 2002 collects the state information of the lamps 2003;

S104: the power conversion unit 2002 controls the action of the simulated load unit 2001 to get a current signal corresponding to the state information of the lamps 2003, and the current signal is transmitted back to the DC distribution box 100 via the power line;

S105: the DC distribution box 100 parses the current signal to obtain the state information of the lamps 2003.

By controlling the action of the switch element in the simulated load unit 2001, the current signal on the power line is obtained. The command specification includes the logical address information and start state detection information of the lamp units 200. The logical address information is used to match the lamp units 200. The start state detection information is used to activate the power conversion unit 2002 to detect the state information of the lamps 2003.

In one embodiment, when there is a need to detect the working state of the lamps, the DC distribution box 100 will activate a command specification for the detection of the working state, and transfer it in form of a voltage signal to the power conversion unit 2002 via the power line.

Figure 6:
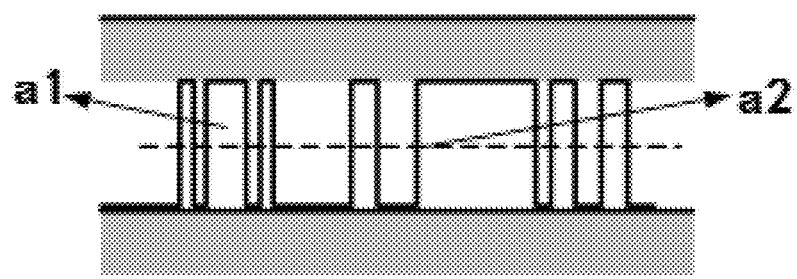
FIG. 6 is a command specification voltage signal output by a DC distribution box in an embodiment of the present disclosure.

Please refer to FIG. 6, which illustrates a command specification voltage signal output by a DC distribution box in an embodiment of the present disclosure. As shown in FIG. 6, the command specification includes the logical address information a1 and the start state detection information a2 of the lamp units 200, wherein the command specification is sent to all the lamp units 200 through the power line, and at the same time, the DC distribution box 100 starts to record the current changed at a measured by the current sensor 300.

The power conversion unit 2002 in the lamp unit 200 receives the voltage and performs the match of the logical address of the lamp unit 200. After confirming that the logical address of the lamp unit 200 matches correctly, the power conversion unit 2002 begins to collect the relevant working states information of the lamps 2003.

After the collection of the state information of the lamps 2003 is completed, the power conversion unit 2002 activates the simulated load unit 2001. a valid signal and an invalid signal are defined according to the differences between the original current signal without activation and the current signal after activating the simulated load unit 2001. The state information of the lamps 2003 is a signal sequence having the valid signal and the invalid signal, and each invalid signal and each valid signal have a fixed time length. Invalid signals and valid signals are arranged and combined in different manners to represent different state information of the lamps 2003. The current signal corresponding to a respective state information of the lamps 2003 is transmitted back to the DC distribution box 100 via the power line. The DC distribution box 100 presets the correspondence rules between the state information of the lamps 2003 and the current signal, and parses the current signal according to the preset correspondence rules to thereby obtain respective state information of the lamps 2003.

Figure 7:
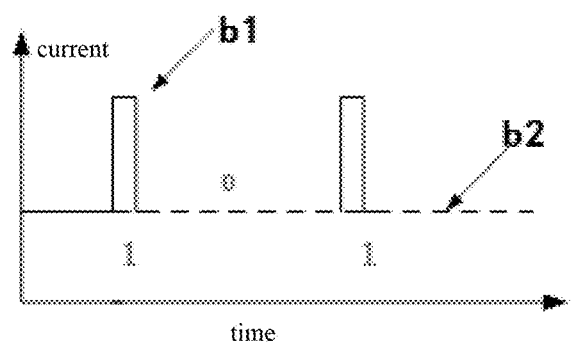
FIG. 7 is a schematic diagram of a current signal on a power line in an embodiment of the present disclosure.

Please refer to FIG. 7, which is a schematic diagram of a current signal on a power line in an embodiment of the present disclosure. As shown in FIG. 7, in actual use, when the simulated load 2001 is not activated, the current on the power line is an original current. Due to the activation of the simulated load 2001, the line current on the power line will change. When the DC distribution box 100 detects a changing current, it can be considered that if a value difference between the current and the original current is within the convention rule, the signal can be defined as a valid signal b1, which can be set to 1; and if the value difference is not within the convention rule, the signal can be defined as an invalid signal b2, which can be set to 0.

In one embodiment, a convention may be made that the time for a set of data is 1 s. For example, for the combination of 1010, 1 is 250 ms, 0 is 250 ms. Then the command is: connecting the simulated load 2001 once, disconnecting the simulated load 2001 once, connecting the simulated load 2001 once, and disconnecting simulated load 2001 once. This command is indicative of the lighting-off of the lamps 2003. Since the current detected by the DC distribution box 100 also varies according to the above rule, it can be parsed that the lamps 2003 are at an off state.

A convention may also be made that the time for a set of data is 1 s. For example, for the combination of 0010, 1 is 250 ms, 0 is 250 ms. Then the command is: disconnecting the simulated load 2001 twice, connecting the simulated load 2001 once, and disconnecting the simulated load 2001 once. This command maybe indicative of the energy consumption of the lamps. Similarly, since the current detected by the DC distribution box 100 also varies according to the above rule, the energy consumption of the lamps 2003 can be parsed.

A convention may further be made that the time for a set of data is 1.5 s. For example, for the combination of 10010, 1 is 250 ms, 0 is 250 ms. Then the command is: connecting the simulated load 2001 once, disconnecting the simulated load 2001 twice, connecting the simulated load 2001 once, and disconnecting the simulated load 2001 once. This command may indicate that the temperature of the lamps 2003 is too high. Similarly, since the current detected by the DC distribution box 100 also varies according to the above rule, it can be parsed that the lamps 2003 are at an over-temperature state.

In this way, various working state data of the lamps may be uploaded over a long distance according to various combinations of 0 and 1 or an adjustable length of time for transmitting data, without changing the state of the lamps. As such, a two-way communication of data on the power line of a high-voltage DC illumination system is realized without changing the brightness or other states of the lamps.

It is worth mentioning that since only the simulated load unit 2001 is adjusted without changing the direct current or voltage provided to the lamps 2003, the state of the lamps can be detected under normal operating state of the lamps without affecting the normal operation, such as brightness, color temperature, etc., of the lamps. Additionally, the entire DC concentrated illumination system achieves two-way communication by use of a power line only, without adding extra communication modules, thereby saving costs. Finally, since each lamp unit 200 has its respective logical address, it is convenient to control individual lamp unit 200, position the lamp unit 200 accurately and control the state detection thereof.

The DC concentrated illumination system of the present disclosure meets the demands for remote control of the modern DC illumination systems, improves product reliability, reduces material consumption, lowers costs, and has good economic benefits.

Of course, the present disclosure may also have other various embodiments. Without departing from the spirit and essence of the present disclosure, those of ordinary skills in the art can make all kinds of corresponding changes and modifications according to the present disclosure. However, these corresponding changes and modifications should all fall within the scope of the present disclosure.

What is claimed is:

1. A DC concentrated illumination system, comprising:
a DC distribution box configured for converting a command specification that controls the state of the lamps into a voltage signal with a varying amplitude, and outputting the voltage signal via a power line; and
a plurality of lamp units, each of which comprises a lamp, a power conversion unit and a simulated load unit, wherein the power conversion unit is coupled to the lamp and the simulated load unit, and is coupled to the DC distribution box via the power line;
wherein the power conversion unit receives the voltage signal and determines whether the voltage signal matches a preset convention rule; if matches successfully, the power conversion unit collects state information of the lamps; and
the power conversion unit controls the action of the simulated load unit to get a current signal corresponding to the state information of the lamps, the current signal is transmitted back to the DC distribution box via the power line; and the DC distribution box parses the current signal to obtain the state information of the lamps.

2. The DC concentrated illumination system of claim 1, wherein the power conversion unit converts a direct current output from the DC distribution box into a constant current or a constant voltage required by the lamp.

3. The DC concentrated illumination system of claim 2, wherein the DC distribution box is provided with a current sensor for detecting the current signal.

4. The DC concentrated illumination system of claim 3, wherein the current sensor is a current Hall or a shunt.

5. The DC concentrated illumination system of claim 3, wherein current sampling accuracy of the current sensor matches the size of the simulated load unit.

6. The DC concentrated illumination system of claim 4, wherein current sampling accuracy of the current sensor matches the size of the simulated load unit.

7. The DC concentrated illumination system of claim 1, wherein the command specification comprises logical address information and start state detection information of the lamp units.

8. The DC concentrated illumination system of claim 1, wherein the convention rule comprises logical address information and start state detection information corresponding to the lamp units, and when a voltage signal received by the power conversion unit matches the convention rule, the power conversion unit starts to collect the state information of the lamps.

9. The DC concentrated illumination system of claim 1, wherein the simulated load unit comprises a switch element or a resistor.

10. The DC concentrated illumination system of claim 9, wherein the switch element is a MOS transistor or a triode.

11. The DC concentrated illumination system of claim 1, wherein the state information of the lamps comprises ON/OFF state information, energy consumption state information or temperature state information.

12. A method for measuring the state of lamps in a DC concentrated illumination system, wherein the DC concentrated illumination system comprises a DC distribution box and a plurality of lamp units coupled to the DC distribution box, each said lamp unit comprises a lamp, a power conversion unit coupled to the lamp, and a simulated load unit coupled to the power conversion unit, the method comprising:
converting, by the DC distribution box, a command specification that controls the lamp units into a voltage signal with a varying amplitude, and transmitting the voltage signal to the power conversion unit via a power line;
receiving, by the power conversion unit, the voltage signal, and judging whether the voltage signal matches a preset convention rule;
collecting, by the power conversion unit, state information of the lamps when matches successfully;
controlling, by the power conversion unit, the action of the simulated load unit to get a current signal corresponding to the state information of the lamps, and transmitting the current signal back to the DC distribution box via the power line;
parsing, by the DC distribution box, the current signal to obtain the state information of the lamps.

13. The method of claim 12, wherein the power conversion unit converts a direct current output from the DC distribution box into a constant current or a constant voltage required by the lamp.

14. The method of claim 12, wherein the convention rule comprises logical address information and start state detection information of the lamp units, the logical address information is used to match the lamp units, and the start state detection information is used to activate the power conversion unit to detect the state information of the lamp.

15. The method of claim 12, wherein a valid signal and an invalid signal are defined according to the differences between the original current signal without activation and the current signal after activating the simulated load unit.

16. The method of claim 15, wherein the state information of the lamps is a signal sequence having the valid signal and the invalid signal, and each invalid signal and each valid signal have a fixed time length.

17. The method of claim 16, wherein invalid signals and valid signals are arranged and combined in different manners to represent respective state information of the lamps.

18. The method of claim 12, wherein the current signal on the power line is obtained by controlling the action of a switch element in the simulated load unit.

19. The method of claim 12, wherein a current sensor arranged in the DC distribution box detects the current signal on the power line.

20. The method of claim 12, wherein the DC distribution box presets the correspondence rules between the state information of the lamps and the current signal.

* * * * *